(12) United States Patent
Cheung et al.

(10) Patent No.: US 10,115,620 B2
(45) Date of Patent: Oct. 30, 2018

(54) APPARATUS AND METHOD FOR ADJUSTMENT OF A HANDLING DEVICE FOR HANDLING ELECTRONIC COMPONENTS

(71) Applicant: ASM Technology Singapore Pte Ltd, Singapore (SG)

(72) Inventors: Yu Sze Cheung, Tuen Mun (HK); Chi Wah Cheng, Tsing Yi (HK); Chi Fung Chan, Tsuen Wan (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 277 days.

(21) Appl. No.: 14/840,404

(22) Filed: Aug. 31, 2015

(65) Prior Publication Data

US 2017/0062256 A1 Mar. 2, 2017

(51) Int. Cl.
  H01L 21/68 (2006.01)
  H01L 21/687 (2006.01)
  G01R 31/28 (2006.01)
  H01L 21/67 (2006.01)
  G01R 31/00 (2006.01)
  G01R 31/44 (2006.01)

(52) U.S. Cl.
  CPC ............ H01L 21/681 (2013.01); G01R 31/00 (2013.01); G01R 31/2851 (2013.01); G01R 31/44 (2013.01); H01L 21/67271 (2013.01); H01L 21/68707 (2013.01); H01L 21/68742 (2013.01); H01L 21/68778 (2013.01)

(58) Field of Classification Search
  CPC ............ H01L 21/681; H01L 21/68778; H01L 21/67271; H01L 21/68707; H01L 21/68742
  See application file for complete search history.

(56) References Cited

U.S. PATENT DOCUMENTS 5,894,218 A * 4/1999 Farnworth ......... G01R 31/2851
  324/750.23
2011/0038694 A1* 2/2011 Khoo ................ H01L 21/67271
  414/222.01

* cited by examiner

Primary Examiner — Obafemi O Sosanya
(74) Attorney, Agent, or Firm — Ostrolenk Faber LLP

(57) ABSTRACT

Disclosed is an apparatus for handling electronic components and a method of adjusting the position of at least one handling device of an apparatus for handling electronic components. The apparatus comprises a rotary device; an imaging device located on the rotary device which is positionable by the rotary device; a plurality of pick heads arranged circumferentially around the rotary device, each pick head being operable to hold an electronic component; a fiducial mark located at a fixed position relative to the rotary device such that the rotary device is rotatable relative to the fiducial mark, the fixed position of the fiducial mark being indicative of an arrangement of an electronic component which is held by a respective pick head; and at least one handling device for handling the electronic components, the position of the at least one handling device being adjustable for aligning the at least one handling device with the arrangement of the electronic component held by the pick head; wherein the imaging device is operative to capture at least one image comprising the fiducial mark and the at least one handling device for deriving an offset between the at least one handling device and the arrangement of the electronic component as indicated by the fixed position of the fiducial mark.

14 Claims, 14 Drawing Sheets

APPARATUS AND METHOD FOR ADJUSTMENT OF A HANDLING DEVICE FOR HANDLING ELECTRONIC COMPONENTS

TECHNICAL FIELD

The present disclosure relates broadly to an apparatus for handling electronic components, and a method of adjusting the position of a handling device of an apparatus for handling electronic components.

BACKGROUND

A conventional test handler comprises a turret and pick heads coupled to the turret for holding semiconductor packages. During operation, the turret rotates above various modules or handling devices of various functions, such as a testing module for testing the performance of the semiconductor packages. A pick head holding a semiconductor package moves to a module or a handling device to perform the functionality of the handling device on the semiconductor package. Specifically, the pick head holding the semiconductor package moves to the testing module in order to test the semiconductor package. In particular, the testing module has to be aligned with respect to each semiconductor package which is held by the respective pick head, in order to achieve good machine stability, a high function test yield, and a low rate of package damage.

At present, the alignment or positional adjustment between the testing module and the semiconductor packages is achieved by using human judgment such as for free adjustment or by using a mechanical jig. Since human judgment is subjective and requires the operation of the test handler to be visualized, it becomes difficult or even impossible to perform manual adjustment if the size of the semiconductor packages is very small. Additionally, this method requires considerable human skill and labour, due to an absence of data on which accuracy may be based.

In one prior art approach, a vision assist module alignment method makes use of an optical device mounted to a turret, and a plurality of imaging devices to first align a fiducial mark and to subsequently align a position of a handling device. However, such an approach requires several alignment steps involving multiple imaging devices. In addition, the optical device increases the weight of the turret and thus, reduces the operation speed of the turret. As a consequence, system throughput is also undesirably decreased.

Thus, there exists a need for an apparatus for handling electronic components, and a method of adjusting the position of at least one handling device of an apparatus for handling electronic components, that seek to address at least one of the above problems.

SUMMARY

A first aspect of the present disclosure is an apparatus for handling electronic components. The apparatus comprises a rotary device; an imaging device located on the rotary device which is positionable by the rotary device; a plurality of pick heads arranged circumferentially around the rotary device, each pick head being operable to hold an electronic component; a fiducial mark located at a fixed position relative to the rotary device such that the rotary device is rotatable relative to the fiducial mark, the fixed position of the fiducial mark being indicative of an arrangement of an electronic component which is held by a respective pick head; and at least one handling device for handling the electronic components, the position of the at least one handling device being adjustable for aligning the at least one handling device with the arrangement of the electronic component held by the pick head; wherein the imaging device is operative to capture at least one image comprising the fiducial mark and the at least one handling device for deriving an offset between the at least one handling device and the arrangement of the electronic component as indicated by the fixed position of the fiducial mark.

A second aspect of the present disclosure is a method of adjusting the position of at least one handling device of an apparatus for handling electronic components, the apparatus comprising a rotary device and a plurality of pick heads arranged circumferentially around the rotary device. The method comprises the steps of: positioning an imaging device located on the rotary device with respect to a fiducial mark located at a fixed position relative to the rotary device such that the rotary device is rotatable relative to the fiducial mark, the fixed position of the fiducial mark being indicative of an arrangement of an electronic component which is held by a respective pick head; capturing at least one image comprising the fiducial mark and at least one handling device using the imaging device; deriving an offset between the fiducial mark and the at least one handling device from the at least one image captured by the imaging device; and adjusting the position of the at least one handling device to align the at least one handling device with respect to the arrangement of the electronic components, based on the said offset.

BRIEF DESCRIPTION OF THE DRAWINGS

Exemplary embodiments of the invention will be better understood and readily apparent to one of ordinary skill in the art from the following written description, by way of example only, and in conjunction with the drawings, in which.

DETAILED DESCRIPTION

Exemplary, non-limiting embodiments may provide an apparatus for handling electronic components, and a method of adjusting the position of at least one handling device of an apparatus for handling electronic components.

Figure 1A:
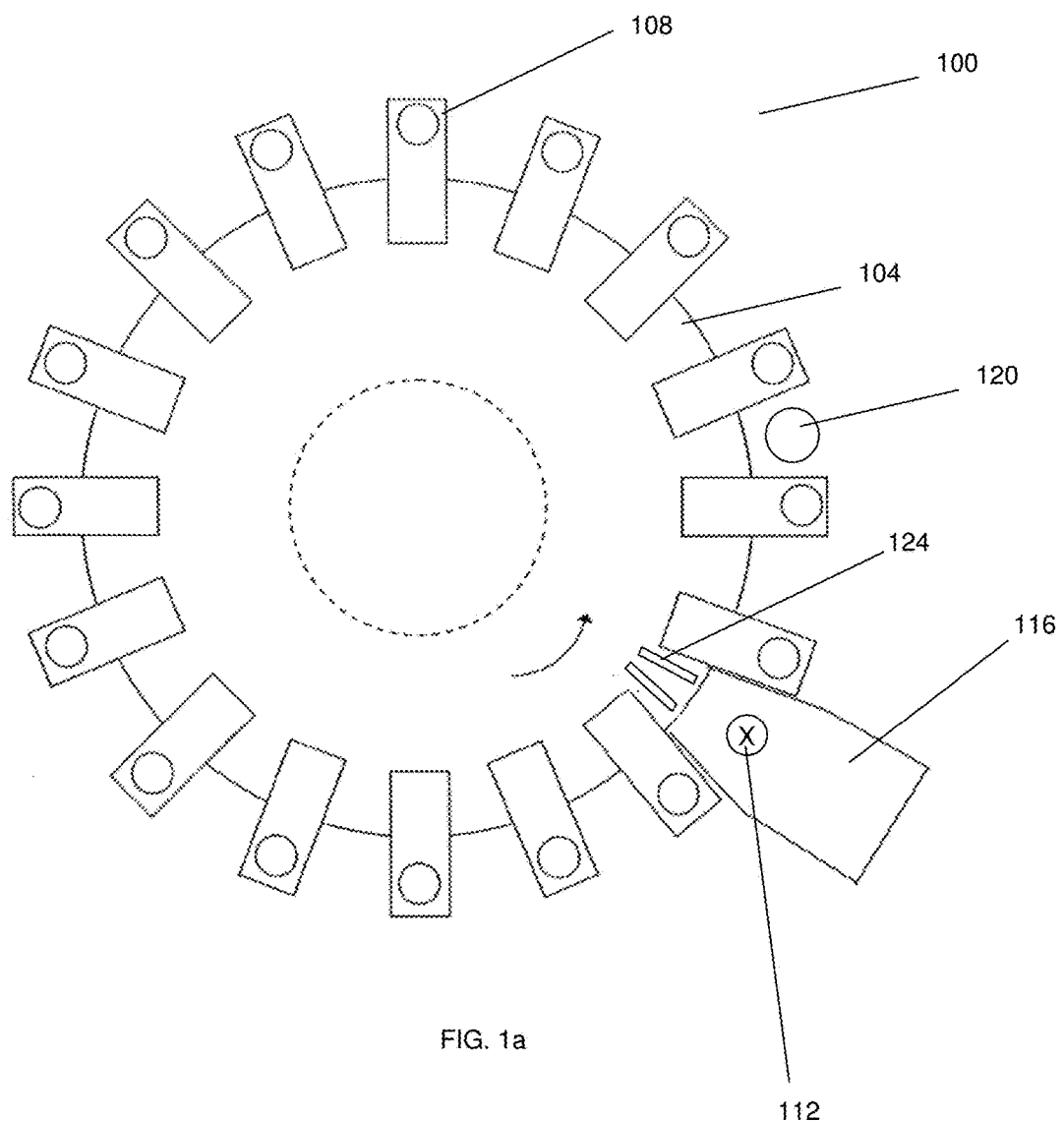
FIG. 1a is a plan view of an apparatus for handling electronic components in an exemplary embodiment.

FIG. 1a is a plan view of an apparatus for handling electronic components in an exemplary embodiment. In the exemplary embodiment, the apparatus for handling electronic components is shown as a test handler 100. The electronic components may be semiconductor components such as semiconductor packages (one of which is indicated by the reference numeral 804 and is held by a pick head collet 808 in FIG. 8).

The test handler 100 comprises a rotary device 104, a plurality of pick heads 108 arranged circumferentially around the rotary device 104 and a fiducial mark 112 such that the rotary device 104 is rotatable relative to the fiducial mark 112. The fiducial mark 112 does not rotate with the rotary device 104. For instance, the fiducial mark 112 is provided by a reference member 116 external to the rotary device 104. The test handler 100 further comprises a handling device 120, such as a contactor, for handling the electronic components. The rotary device 104 also comprises a mounting member 124 to which an imaging device is detachably mountable (not shown in FIG. 1a).

Figure 1B:
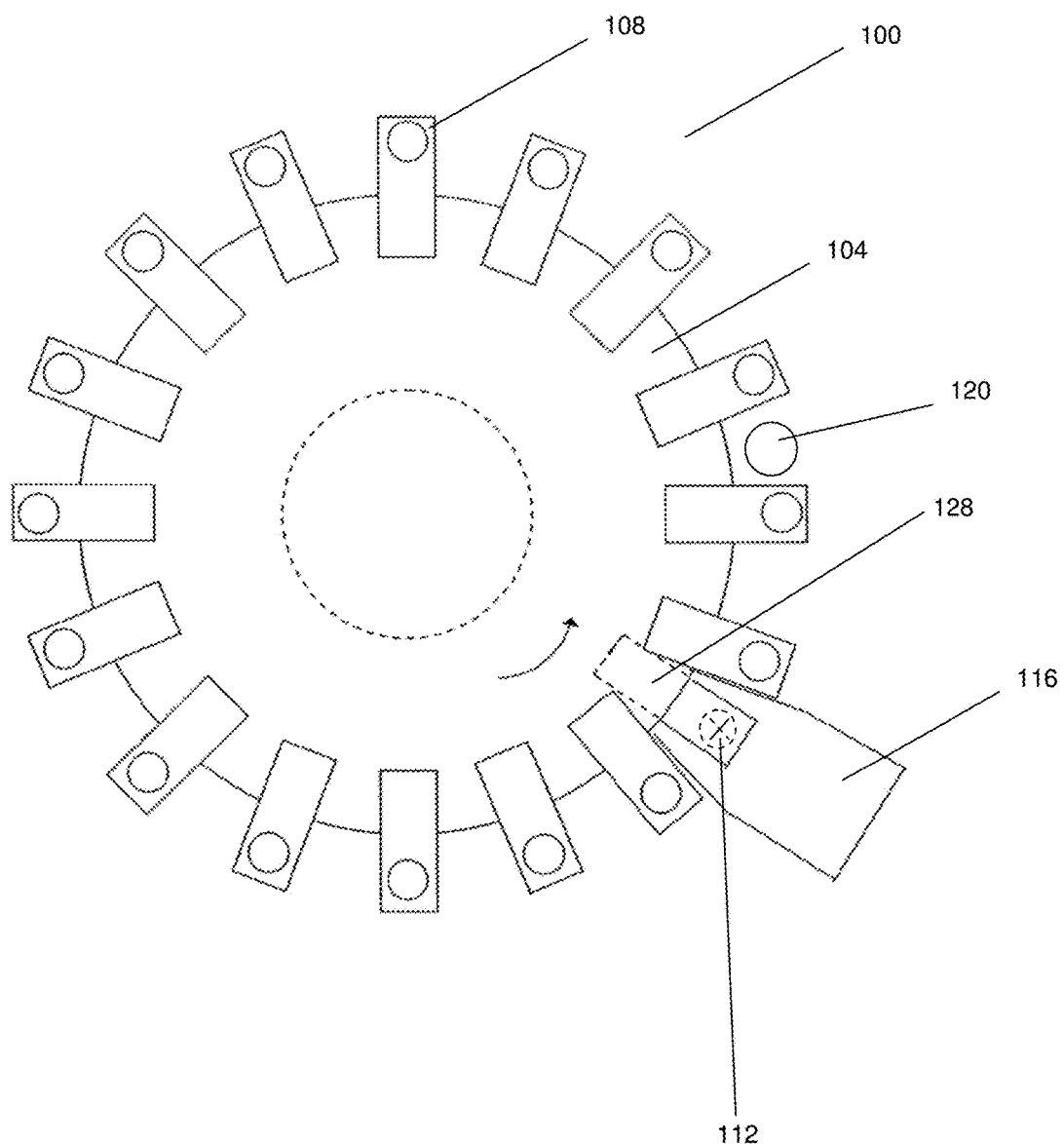
FIG. 1b is a plan view of the apparatus for handling electronic components with an imaging device mounted on the apparatus.
Figure 1C:
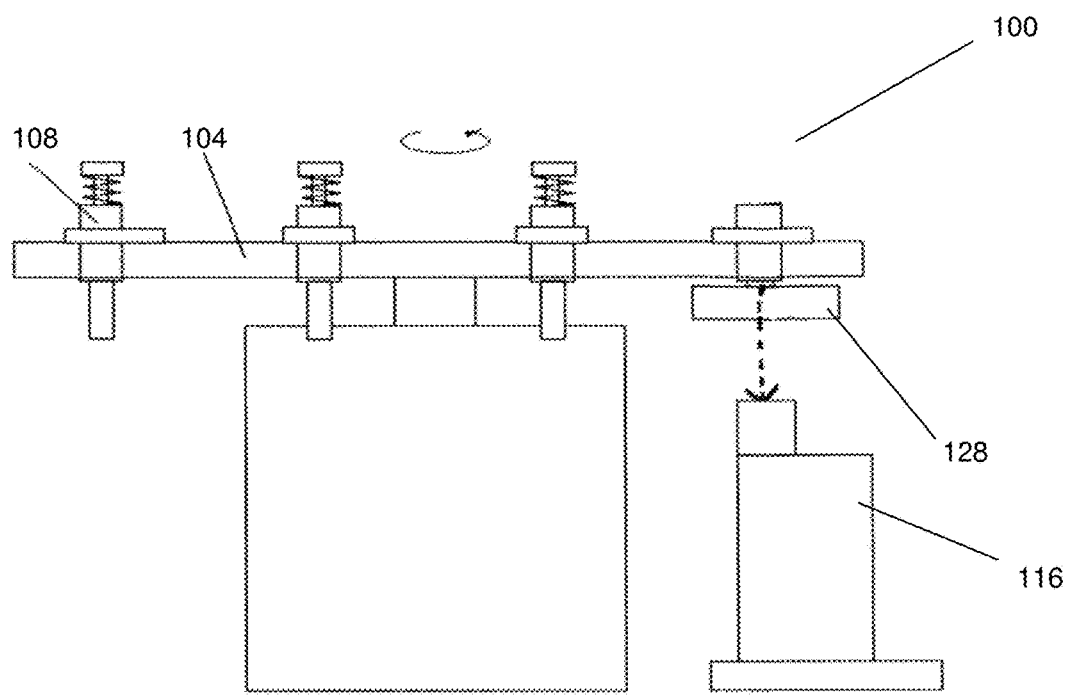
FIG. 1c is a side view of the apparatus for handling electronic components with the imaging device mounted on the apparatus.

FIG. 1b is a plan view of the apparatus for handling electronic components with an imaging device mounted on the apparatus. FIG. 1c is a side view of the apparatus for handling electronic components with the first imaging device mounted on the apparatus.

In the exemplary embodiment, an imaging device 128 is detachably mounted to the rotary device 104 at a position between two adjacent pick heads 108 via using the mounting member 124. The imaging device 128 is positionable by the rotary device 104. In FIG. 1b, the rotary device 104 is rotated such that the imaging device 128 is disposed over and above the fiducial mark 112 provided by the reference member 116.

In the exemplary embodiment, the reference member 116 comprising the fiducial mark 112 is located at a pre-determined position that is indicative of the arrangement of an electronic component when it is held by a respective pick head 108. That is, the fiducial mark 112 is located at a fixed position relative to the rotary device 104 such that the rotary device 104 is rotatable relative to the fiducial mark 112. The imaging device 128 is operative to capture at least one image comprising the fiducial mark 112 provided by the reference member 116 that is external to the rotary device 104 and the at least one handling device 120 for deriving an offset between the at least one handling device 120 and the arrangement of the electronic component as indicated by the fixed position of the fiducial mark 112. The position of the at least one handling device 120 is adjustable for aligning the handling device 120 with the arrangement of the electronic component held by the pick head 108.

In the exemplary embodiment, the rotary device 104 may be a turret. Each pick head 108 is operable to hold an electronic component (not shown in FIGS. 1a to 1c). The imaging device 128 may be a camera. The mounting member may be, but is not limited to, one or more screws, rivets, snap-fit assemblies, clips or other fastening components, for mounting the imaging device 128 to the rotary device 104.

In the exemplary embodiment, the at least one handling device 120 is movably mounted under the rotary device 104.

In the exemplary embodiment, the fiducial mark 112 is a pattern which can be easily inspected by the imaging device 128. The fiducial mark 112 may be, but is not limited to, a cross pattern or a chessboard pattern. The reference member 116 comprising the fiducial mark 112 is mounted at a pre-determined position under the rotary device 104. For instance, the reference member 116 may be mounted on a stationary platform under the rotary device 104. The fiducial mark 112 is used as a common reference mark for alignment of the at least one handling device 120 to electronic components held by the respective pick heads 108.

The use of the fiducial mark 112 provided on the external reference member 116 for positional adjustment of a handling device such as a contactor will now be described.

Figure 2A:
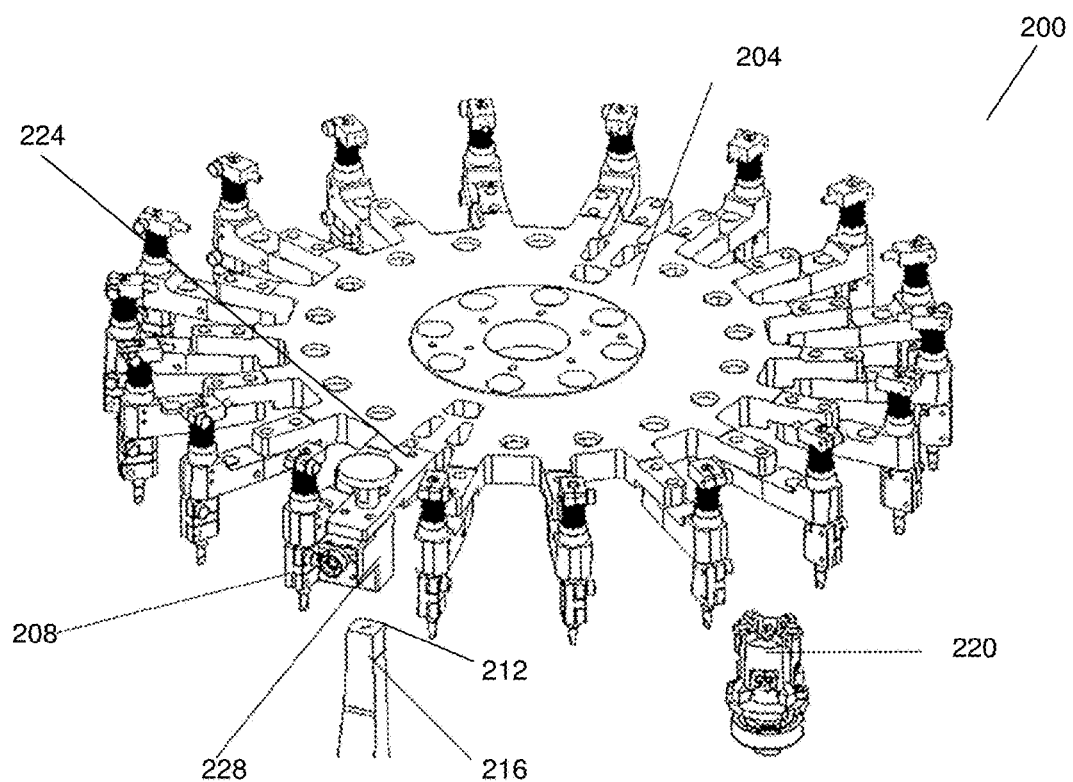
FIG. 2a is a perspective view of an apparatus for handling electronic components with an imaging device mounted on the apparatus in an exemplary embodiment.

FIG. 2a is a perspective view of an apparatus for handling electronic components with an imaging device mounted on the apparatus in an exemplary embodiment. In the exemplary embodiment, the apparatus is a test handler 200 that functions substantially identically to the test handler 100 described with reference to FIGS. 1a to 1c and comprises substantially identical components. The imaging device 228 of the test handler 200 is shown positioned over the fiducial mark 212 provided by the reference member 216 that is external to the rotary device 204.

The imaging device 228 is operative to capture at least one image comprising the fiducial mark 212. In other exemplary embodiments, it may be possible to inspect or view the fiducial mark to align the imaging device or to take note of the offset between an optical centre of the imaging device and the fiducial mark.

Figure 2B:
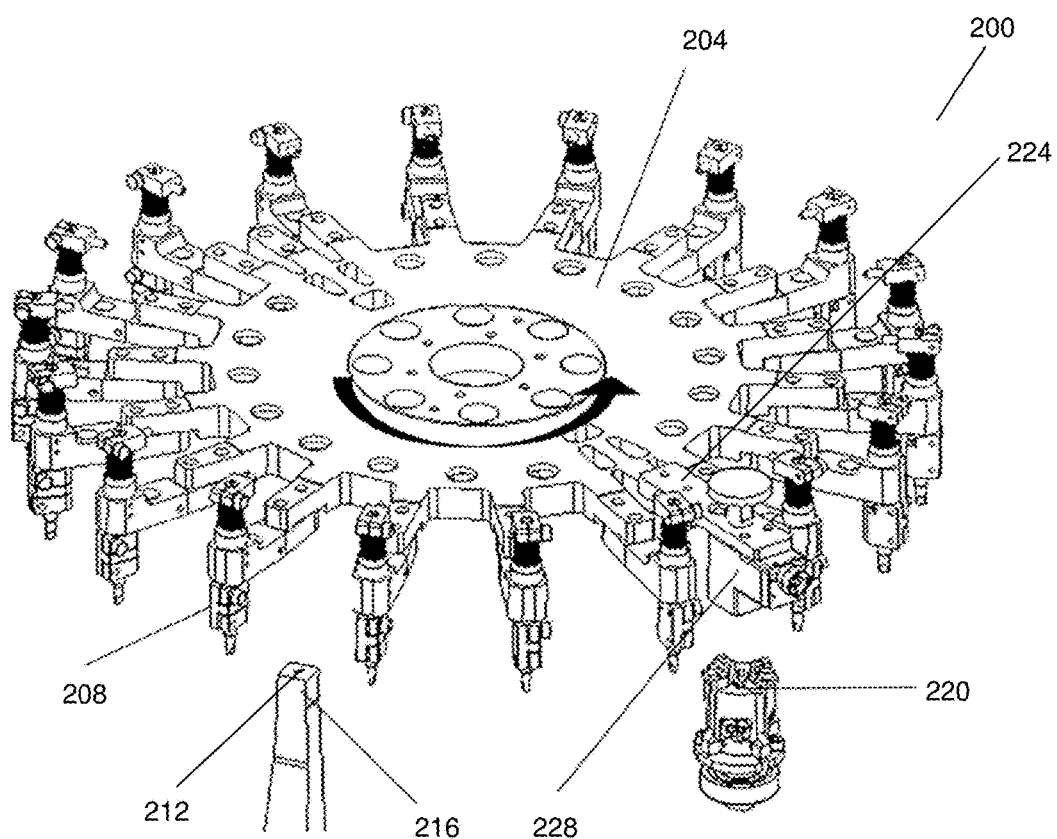
FIG. 2b is a perspective view of the apparatus for handling electronic components with the imaging device mounted on the apparatus.

After the imaging device 228 captures at least one image of the fiducial mark 212, the rotary device 204 is rotated through an angle to dispose the imaging device 228 above the top of a handling device 220 of which the position of the handling device 220 is to be aligned. In FIG. 2b, the rotary device 204 is shown rotated such that the detachably mounted imaging device 228 is disposed above a position of the handling device 220.

The positional adjustment of the handling device will now be described.

Figure 3:
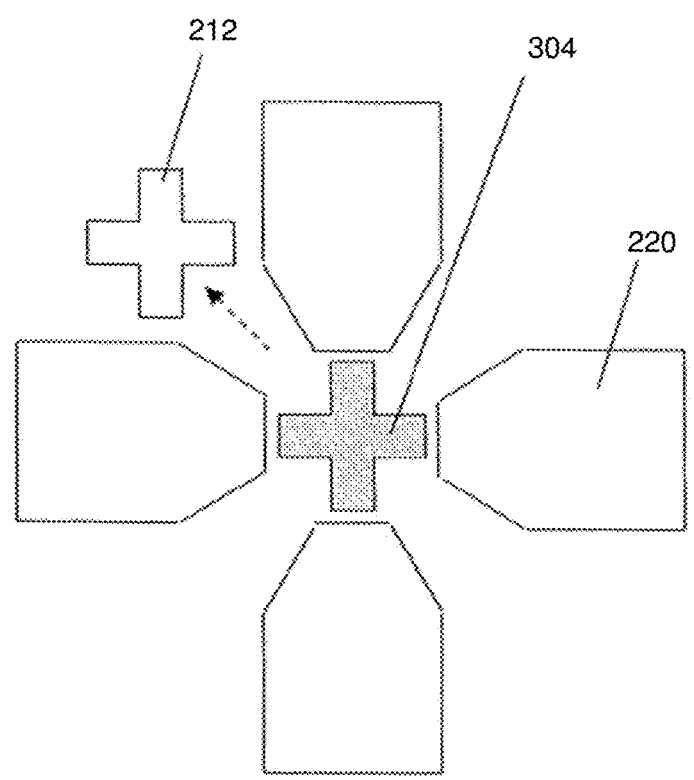
FIG. 3 is a plan view of a composite image captured by the imaging device in the exemplary embodiment.

FIG. 3 is a plan view of a composite image captured by the imaging device 228 in the exemplary embodiment. The plan view shows an image of the handling device 220 with its centre marking 304 and an image of the fiducial mark 212. The composite image is analysed to derive an offset between the position of the fiducial mark 212 and the position of the handling device 220. Thereafter, the handling device 220 is adjusted either manually or by automation based on the offset to align or overlap the centre marking 304 of the handling device 220 with the position of the image of the fiducial mark 212. The repositioned handling device 220 is therefore aligned with respect to the positional arrangement of the electronic components held by the respective pick heads.

Using the exemplary embodiments, even if a centre mark is not provided on a handling device such as a test contactor, the handling device may still be aligned with the fiducial mark, as described below.

Figure 4A:
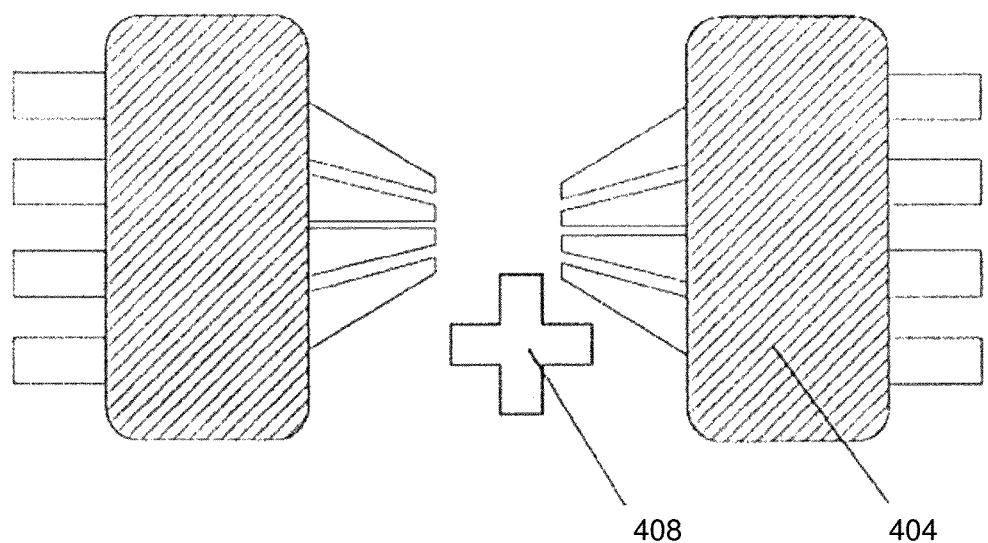
FIG. 4a is a plan view of an image captured by the imaging device in another exemplary embodiment.
Figure 4B:
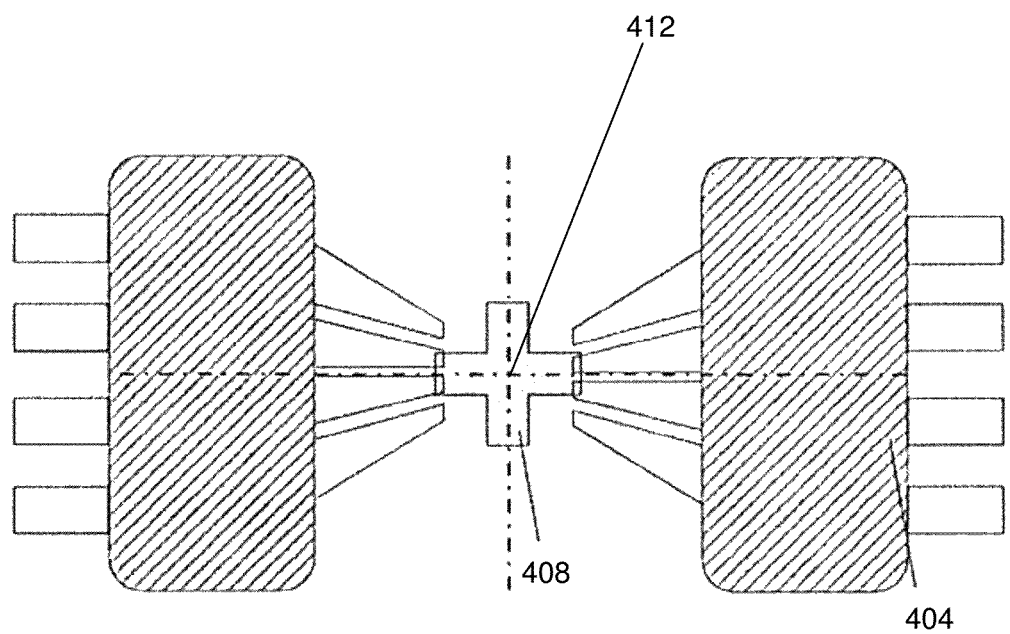
FIG. 4b is a plan view of another image captured by the imaging device in the exemplary embodiment.

FIGS. 4a and 4b are plan views of images captured by the imaging device in another exemplary embodiment. In the exemplary embodiment, the plan view shows an image of a test contactor 404 with no physical centre mark. The plan view also shows an image of the fiducial mark 408. The method of positional adjustment described with reference to FIG. 3 can be used even when no physical marking is provided on the test contactor 404 to denote the centre of the test contactor 404. The captured images of the test contactor 404 and of the fiducial mark 408 are analysed to locate the position of the fiducial mark 408 and the centre of symmetry 412 of the test contactor 404 (as shown in FIG. 4a). Thereafter, the test contactor 404 is adjusted either manually or by automation to align or overlap the centre of symmetry 412 of the test contactor 404 with the position of the image of the fiducial mark 408 (as shown in FIG. 4b). The repositioned test contactor 404 is therefore aligned with respect to the positional arrangement of the electronic components held by the respective pick heads.

Figure 5:
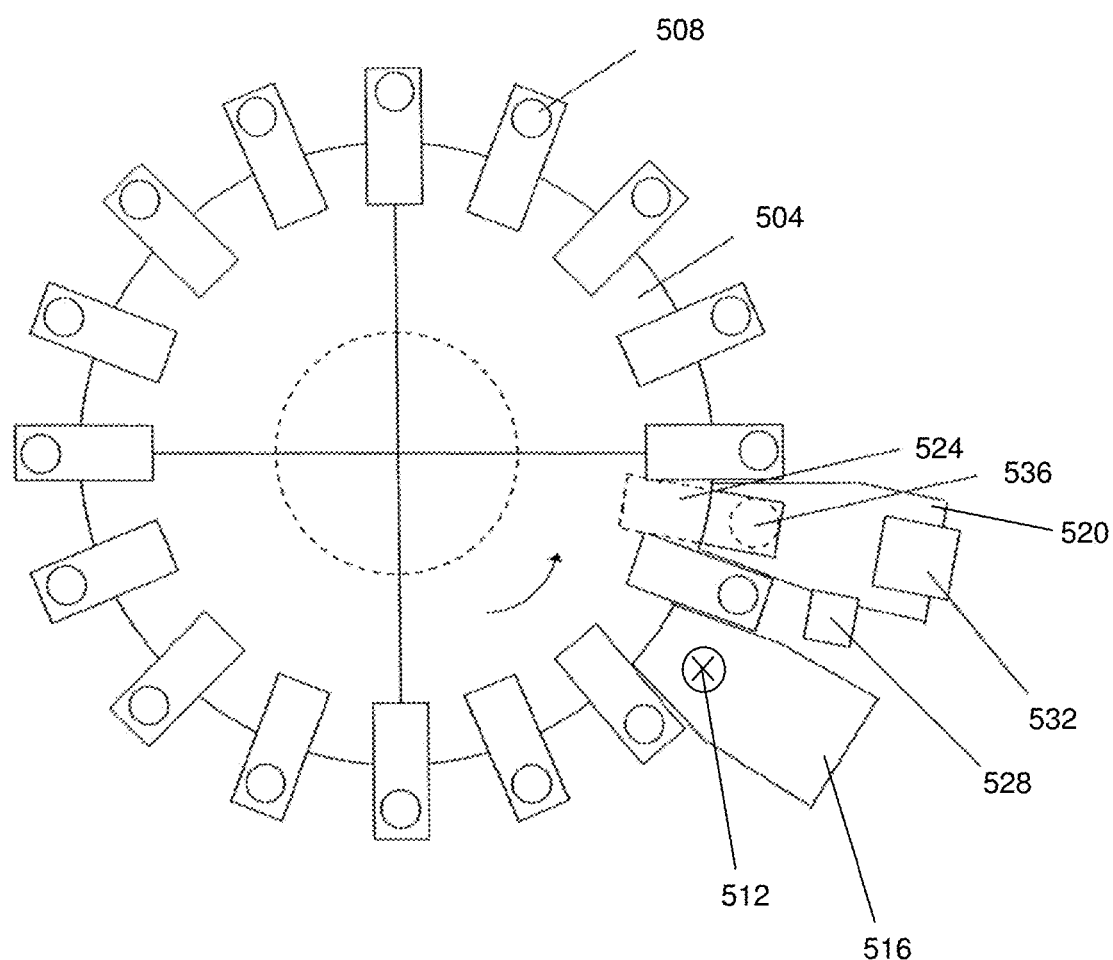
FIG. 5 is a plan view of an apparatus for handling electronic components with an imaging device mounted on the apparatus in an exemplary embodiment including a motorised handling device.

FIG. 5 is a plan view of an apparatus for handling electronic components with an imaging device mounted on the rotary device 504 of the apparatus in an exemplary embodiment including a motorised handling device. A handling device in the form of a contactor 520 optionally comprises motors 528, 532, 536 to provide tangential, radial and theta motion relative to the motion path of electronic components held by the respective pick heads 508. After the offset between a fiducial mark 512 provided by a reference member 516 and the motorised contactor 520 is derived from one or more images captured by an imaging device 524, a host processor sends corresponding instructing signals to the motors 528, 532, 536 to compensate for the offset, such as in terms of a distance-and-angle difference between the fiducial mark 512 and the motorised contactor 520 to adjust the position of the motorised contactor 520 with respect to the arrangement of each electronic component for handling as indicated by the fixed position of the fiducial mark 512. Automatic alignment of the apparatus may thus be achieved by using the measurement feedback information from the imaging device 524 and provision of motors on the motorised contactor 520.

In the following description, the mounting member of the rotary device is described.

Figure 6:
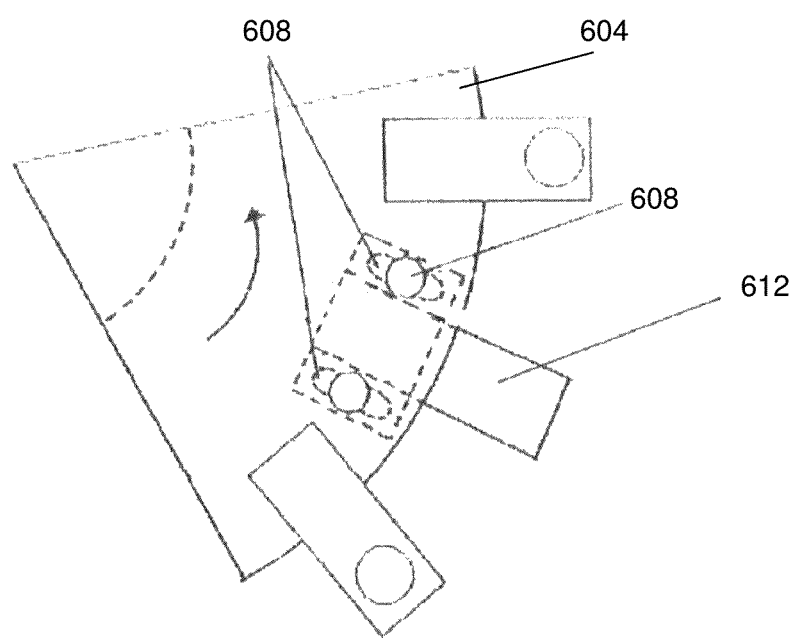
FIG. 6 shows an imaging device attached to a rotary device in an enlarged partial view of the rotary device.

FIG. 6 shows an imaging device attached to a rotary device in an enlarged partial view of the rotary device. A mounting member 608 is used for detachably mounting an imaging device 612 to a rotary device 604. The mounting member 608 comprises one or more screws, rivets, snap-fit assemblies, clips or any other type of fastening components. The mounting member 608 further comprises respective tracks, holes or other receptacles provided on the rotary device 604 for receiving the respective screws, rivets, snap-fit assemblies, clips or any other fastening components.

The mounting member 608 may be integral to the rotary device 604 or may be a separate component to the rotary device 604. In an exemplary embodiment wherein the mounting member 608 is integral to the rotary device 604, the mounting member 608 may comprise an arm extending from the rotary device 604 and one or more tracks or grooves for receiving one or more screws or rivets. The imaging device 612 may be adjusted such as by, adjusting the one or more screws, rivets, snap-fit assemblies or clips until the imaging device is located at a position to inspect/view or clearly capture at least one image of the fiducial mark.

It should be appreciated that it is not necessary to align the optical centre of the imaging device to the optical centre of the fiducial mark so long as an average offset between the optical centre of the handling device and the optical centre of the fiducial mark can be determined.

The exemplary embodiments above describe capturing an image of the mark and of the handling device. Described below is an exemplary embodiment whereby only one image is captured for the positional adjustment process.

Figure 7A:
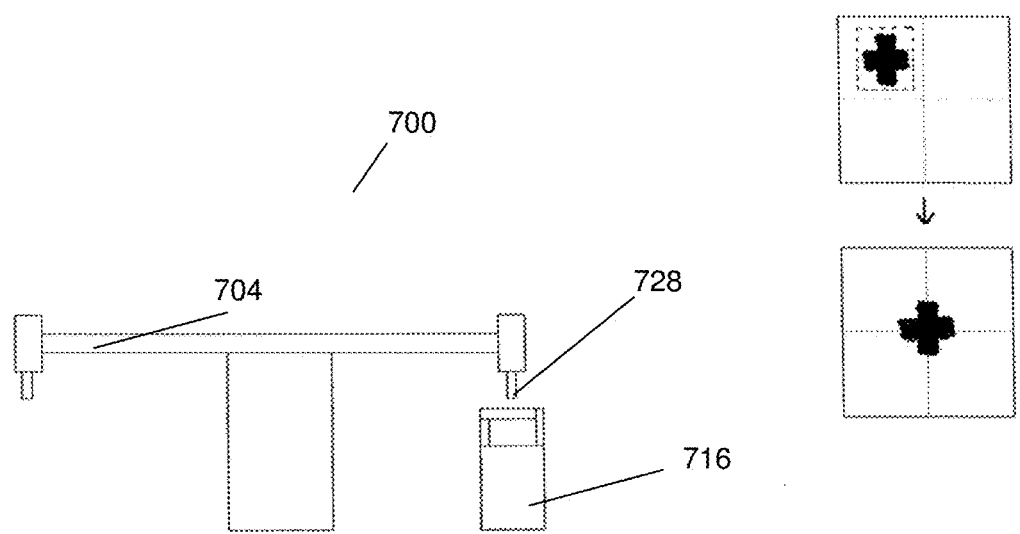
FIG. 7a is a side view of an apparatus for handling electronic components having an imaging device mounted on the apparatus in an exemplary embodiment.

FIG. 7a is a side view of an apparatus for handling electronic components having an imaging device mounted on the apparatus in an exemplary embodiment. In the exemplary embodiment, the apparatus for handling electronic components is a test handler 700 substantially identical to the test handler 100. An imaging device 728 mounted on a rotary device 704 is positioned to inspect or view an image of a fiducial mark (not shown in FIG. 7a). The fiducial mark is provided such that the rotary device 704 is rotatable relative to the fiducial mark. For instance, the fiducial mark is provided on a reference member 716 that is external to the rotary device 704.

After the inspection, an optical centre of the imaging device 728 is aligned to the optical centre of the fiducial mark. However, it should be appreciated that it is not necessary to align the optical centre of the imaging device 728 to the optical centre of the fiducial mark so long as an average offset between the optical centre of the imaging device 728 and the optical centre of the fiducial mark is determinable such that the offset can be compensated.

Figure 7B:
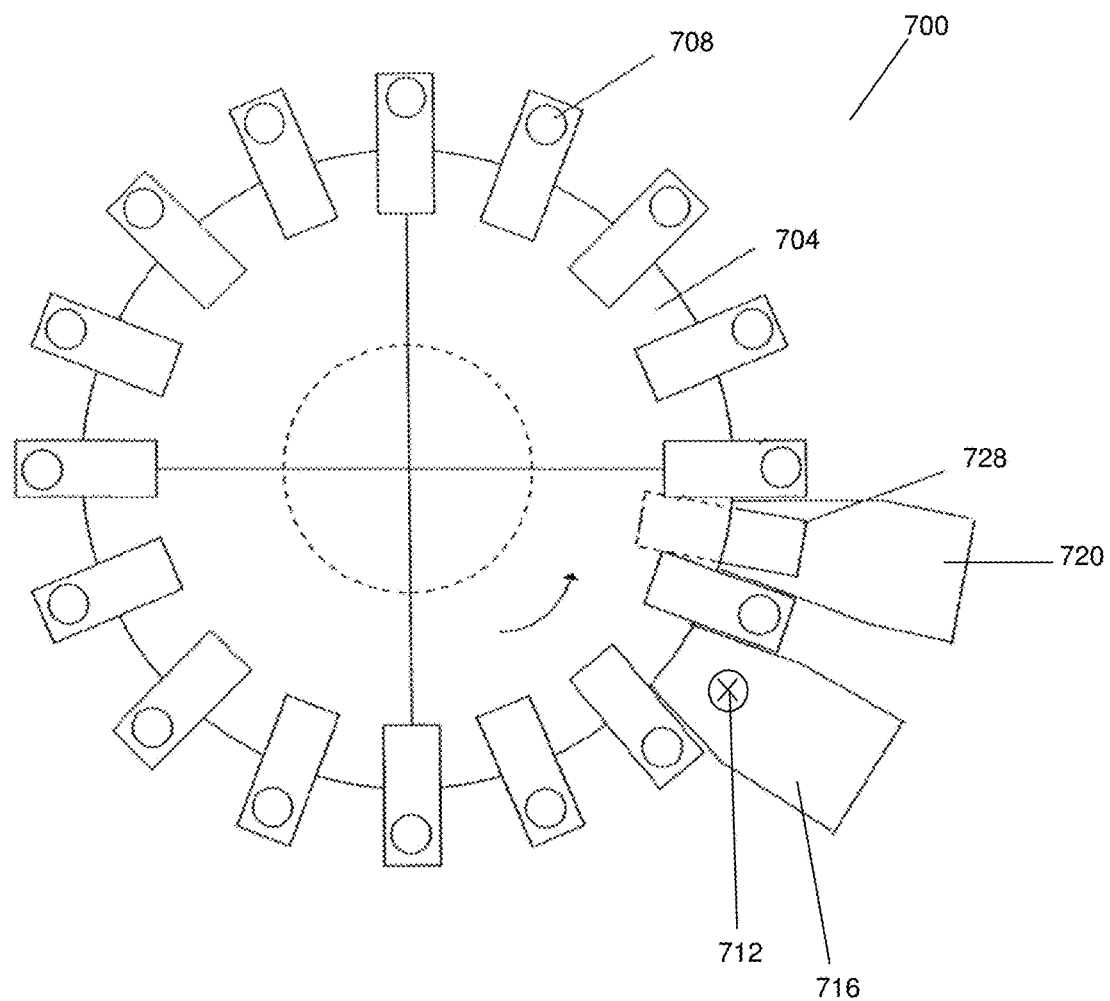
FIG. 7b is a plan view of the apparatus for handling electronic components with the imaging device above a handling device in the exemplary embodiment.

Next, the rotary device 704 is rotated through an angle to dispose/arrange the imaging device 728 above a handling device 720 which is to be aligned, as shown in a plan view in FIG. 7b.

The imaging device 728 is positioned to capture an image of the handling device 720. Subsequently, the position of the image of the handling device 720 is compared to the position of the optical centre of the imaging device 728 or fiducial mark 712. The position of the handling device 720 is then adjusted manually or automatically based on the known offset, if any, between the centre of the imaging device 728 and the fiducial mark 712.

Figure 7C:
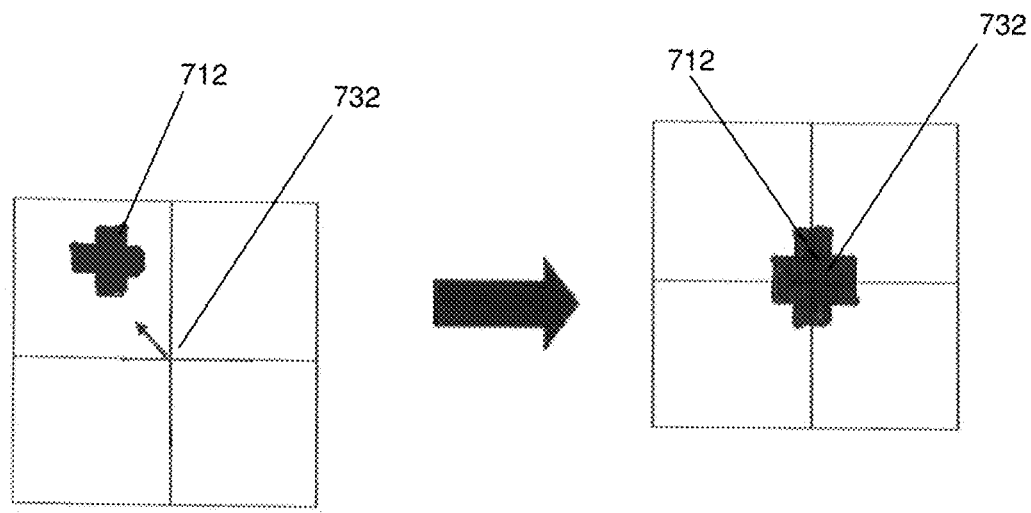
FIG. 7c is a drawing showing the viewing of a fiducial mark in a positional adjustment process in the exemplary embodiment.
Figure 7D:
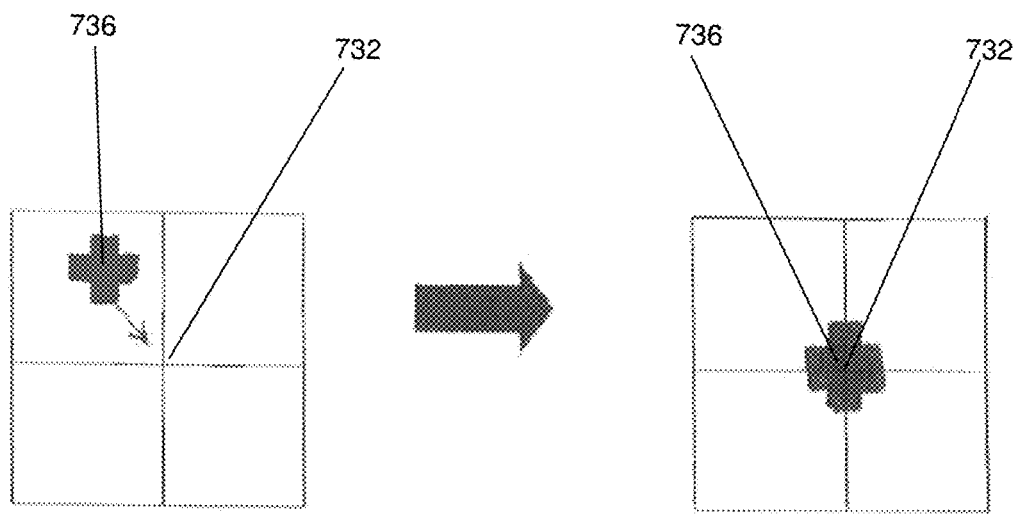
FIG. 7d is a drawing showing the viewing of the handling device in the positional adjustment process in the exemplary embodiment.

For instance, as shown in FIG. 7c, during the viewing of the fiducial mark 712, the optical centre 732 of the imaging device is aligned to the optical centre of the fiducial mark 712 by calculating its offset. Next, as shown in FIG. 7d, as the position of the fiducial mark (or its offset) is known, the optical centre 736 of the handling device may be aligned using the image taken of the handling device with the imaging device.

Figure 8:
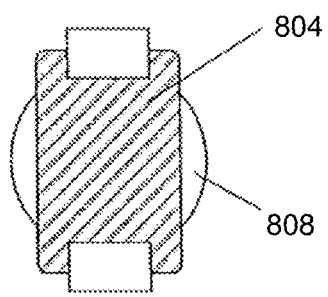
FIG. 8 is a plan view of an electronic component being held by a pick head in an exemplary embodiment.

FIG. 8 is a plan view of an electronic component being held by a pick head in an exemplary embodiment. As shown, an electronic component 804 (such as a semiconductor component or package) is held by a pick head collet 808 of a pick head (such as 108 of FIGS. 1a to 1c, or 208 of FIG. 2a to 2b, or 708 of FIG. 7).

Figure 9:
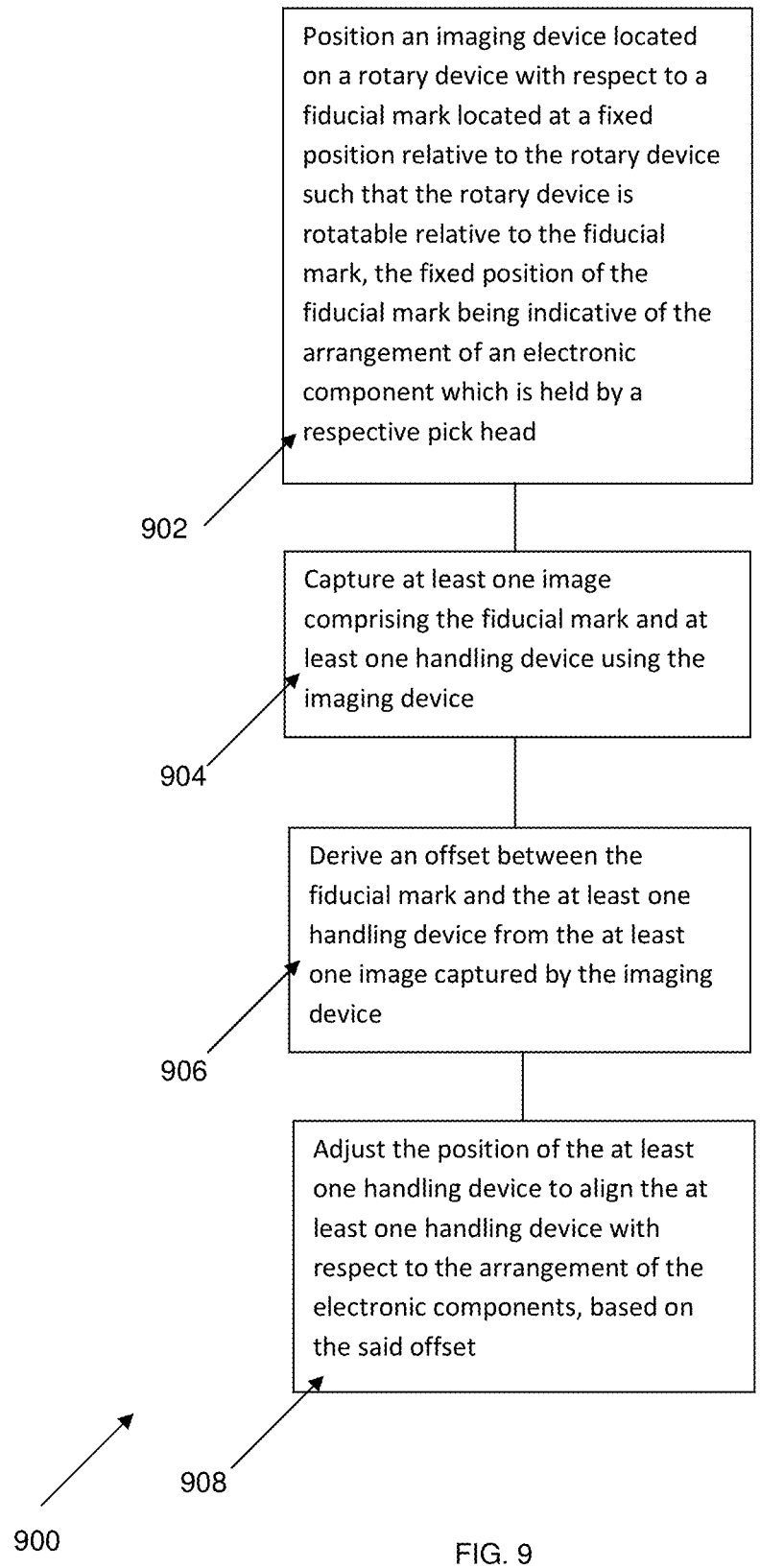
FIG. 9 is a flowchart which illustrates a method of adjusting the position of at least one handling device of an apparatus for handling electronic components in an exemplary embodiment, the apparatus comprising a rotary device and a plurality of pick heads arranged circumferentially around the rotary device.

FIG. 9 is a flowchart 900 which illustrates a method of adjusting the position of at least one handling device of an apparatus for handling electronic components in an exemplary embodiment, the apparatus comprising a rotary device and a plurality of pick heads arranged circumferentially around the rotary device. At step 902, an imaging device located on the rotary device is positioned with respect to a fiducial mark located at a fixed position relative to the rotary device such that the rotary device is rotatable relative to the fiducial mark, the fixed position of the fiducial mark being indicative of an arrangement of an electronic component which is held by a respective pick head. At step 904, the imaging device captures at least one image comprising the fiducial mark and at least one handling device. At step 906, an offset between the fiducial mark and the at least one handling device from the at least one image captured by the imaging device is derived. At step 908, the position of the at least one handling device is adjusted to align the at least one handling device with respect to the arrangement of the electronic components, based on the said offset.

For the described exemplary embodiments, after alignment of the handling device with respect to the arrangement of the electronic components is completed, the imaging device may be detached or removed from the rotary device prior to production run of the apparatus for handling electronic components.

In the described exemplary embodiments, providing the fiducial mark such that the rotary device is rotatable relative to the fiducial mark advantageously removes the provision of a fiducial mark bearing member on the rotary device and thus, reduces the weight on the rotary device. This reduction in weight increases the rotation speed of the rotary device when the rotary device is in operation and therefore, advantageously improves output productivity. Advantageously, the imaging device may be detached or removed from the rotary device after alignment of the handling device with respect to the arrangement of the electronic components is completed and prior to production run of the apparatus for handling electronic components. Therefore, no additional weight, either from an imaging device or a fiducial mark bearing member, is imposed on the rotary device during the production run. The alignment or adjustment procedure is also advantageously simplified since the position of the fiducial mark is already pre-determined during the manufacture of the apparatus. Moreover, using the pre-determined fiducial mark to align handling devices may provide high accuracy of the alignment process since the need of a user's intervention to adjust the position of a fiducial/reference point during each alignment process may be eliminated.

Further, by using the imaging device to capture at least one image comprising the fiducial mark and the handling device during the alignment process, no contact needs to be made between the electronic components, the pick head, the imaging device and/or the handling device during this alignment process. This advantageously prevents damage from being caused to the electronic components, the pick head, the imaging device and/or the handling device during the alignment process.

In addition, the at least one image captured by the imaging device provides a clear visualization for an easy alignment process.

Furthermore, measurement feedback from a vision or imaging system allows the position of the handling device to be adjusted based on an offset between the fiducial mark and the handling device. Quantitative measurement on the alignment results can therefore be achieved. In some exemplary embodiments, the measured feedback together with motors provided on the handling devices, allow the position of the handling devices to be automatically adjusted. Hence, the alignment process can be automated. This automatic alignment process can be implemented on handling devices where it is difficult to perform the alignment by using human judgment such as for free adjustment or by using a mechanical jig, for instance for alignment of a tape and reel module.

In the described exemplary embodiments above, the at least one handling device is a test contactor but it should be understood that there can be other handling devices that are related to production/testing of electronic components.

In some exemplary embodiments, the fiducial mark is described as being provided by a reference member external to the rotary device. It should be understood that the exemplary embodiments are not limited as such. As long as the fiducial mark is located at a fixed position relative to the rotary device such that the rotary device is rotatable relative to the fiducial mark, the conventional need for a fiducial mark bearing member to be placed on the rotary device is advantageously removed.

In some exemplary embodiments, the image of the fiducial mark is overlaid (or superimposed) on the image of the handling device as captured by the imaging device. The image of the handling device may include any image that is indicative of the position of the handling device, and may comprise one or more parts of the handling device and/or a mark that is derived from the handling device.

During the alignment process, there may be a degree of tolerance or stipulated criterion provided for ensuring alignment of the handling device to the fiducial mark. That is, the exemplary embodiments, are not limited to strict positioning of the handling device to an image of the fiducial mark. In some exemplary embodiments, an optical centre of the handling device is aligned to the fiducial mark. However, it should be appreciated that it is not necessary to align the optical centre of the handling device to the fiducial mark so long as the degree of tolerance or stipulated criterion provided for ensuring alignment of the handling device to the fiducial mark is satisfied.

It should be appreciated that while some exemplary embodiments describe using an image of a fiducial mark and an image of a handling device, the exemplary embodiments are not limited as such. As long as at least one image is obtained, a vision or imaging system may perform alignment using the at least one image.

It will be appreciated by a person skilled in the art that other variations and/or modifications may be made to the specific embodiments without departing from the scope of the invention as broadly described. The present embodiments are, therefore, to be considered in all respects to be illustrative and not restrictive.

The invention claimed is:

1. An apparatus for handling electronic components, the apparatus comprising:
   a rotary device;
   an imaging device located on the rotary device which is positionable by the rotary device;
   a plurality of pick heads arranged circumferentially around the rotary device, each pick head being operable to hold an electronic component;
   a fiducial mark located at a fixed position relative to the rotary device such that the rotary device is rotatable relative to the fiducial mark, the fixed position of the fiducial mark being indicative of an arrangement of an electronic component which is held by a respective pick head; and
   at least one handling device for handling the electronic components, the position of the at least one handling device being adjustable for aligning the at least one handling device with the arrangement of the electronic component held by the pick head;

wherein the imaging device is operative to capture at least one image comprising the fiducial mark and the at least one handling device for deriving an offset between the at least one handling device and the arrangement of the electronic component as indicated by the fixed position of the fiducial mark.

2. The apparatus of claim 1, wherein the handling device is adjustable to align it to the fiducial mark based on an offset between the imaging device and the fiducial mark that is derived.

3. The apparatus of claim 1, wherein the fiducial mark is comprised in a reference member which is external to the rotary device.

4. The apparatus of claim 1, wherein the imaging device is a camera.

5. The apparatus of claim 1, wherein the at least one handling device is motorised and is operable to automatically align the at least one handling device with respect to the arrangement of the electronic component as indicated by the fixed position of the fiducial mark.

6. The apparatus of claim 1, further comprising a mounting member located on the rotary device to which the imaging device is detachably mountable.

7. The apparatus of claim 1, wherein the imaging device is operative to capture a first image comprising the fiducial mark, and a second image comprising the at least one handling device.

8. A method of adjusting the position of at least one handling device of an apparatus for handling electronic components, the apparatus comprising a rotary device and a plurality of pick heads arranged circumferentially around the rotary device, the method comprising the steps of:

positioning an imaging device located on the rotary device with respect to a fiducial mark located at a fixed position relative to the rotary device such that the rotary device is rotatable relative to the fiducial mark, the fixed position of the fiducial mark being indicative of an arrangement of an electronic component which is held by a respective pick head;

capturing at least one image comprising the fiducial mark and at least one handling device using the imaging device;

deriving an offset between the fiducial mark and the at least one handling device from the at least one image captured by the imaging device; and adjusting the position of the at least one handling device to align the at least one handling device with respect to the arrangement of the electronic components, based on the said offset.

9. The method of claim 8, further comprising a step of detachably mounting the imaging device to a mounting member for locating the imaging device on the rotary device.

10. The method of claim 8, wherein the fiducial mark is comprised in a reference member which is external to the rotary device.

11. The method of claim 8, wherein the step of adjusting the position of the at least one handling device further comprises the step of adjusting the handling device such that an optical centre of the handling device is aligned with respect to an optical centre of the fiducial mark.

12. The method of claim 8, wherein the at least one handling device is motorised and the step of adjusting the position of the at least one handling device is automatically performed based on the said offset.

13. The method of claim 8, wherein the step of capturing at least one image comprising the fiducial mark and at least one handling device using the imaging device comprises a step of capturing a first image of the fiducial mark and a second image of the at least one handling device.

14. The method of claim 8, wherein the step of adjusting the position of the at least one handling device comprises a step of adjusting the at least one handling device based on a derived offset between the imaging device and the fiducial mark.

* * * * *